US008633054B2

(12) United States Patent
Kim

(10) Patent No.: US 8,633,054 B2
(45) Date of Patent: Jan. 21, 2014

(54) ORGANIC LIGHT-EMITTING DISPLAY DEVICE AND METHOD OF MANUFACTURING THE SAME

(75) Inventor: Bong-Ju Kim, Suwon-si (KR)

(73) Assignee: Samsung Display Co., Ltd., Giheung-Gu, Yongin, Gyeonggi-do (KR)

(*) Notice: Subject to any disclaimer, the term of this patent is extended or adjusted under 35 U.S.C. 154(b) by 242 days.

(21) Appl. No.: 13/298,738

(22) Filed: Nov. 17, 2011

(65) Prior Publication Data
US 2012/0175617 A1 Jul. 12, 2012

(30) Foreign Application Priority Data

Jan. 7, 2011 (KR) .................. 10-2011-0001965

(51) Int. Cl.
*H01L 51/52* (2006.01)
*H01L 51/56* (2006.01)
*H01L 33/44* (2010.01)

(52) U.S. Cl.
USPC ............ 438/99; 257/40; 257/99; 257/E33.06; 257/E51.018; 257/E51.019; 257/E51.02

(58) Field of Classification Search
USPC ........... 257/40, 99, E33.06, E51.02, E51.019; 438/99
See application file for complete search history.

(56) References Cited

U.S. PATENT DOCUMENTS 6,762,802 B2 * 7/2004 Ono et al. .................. 349/38

FOREIGN PATENT DOCUMENTS

| KR | 10-0721955 | 5/2007 |
| KR | 10-2007-0059584 | 6/2007 |
| KR | 10-0787438 | 12/2007 |

* cited by examiner

*Primary Examiner* — Evan Pert
(74) *Attorney, Agent, or Firm* — Robert E. Bushnell, Esq.

(57) ABSTRACT

In an organic light-emitting display device and a method of manufacturing the same, the organic light-emitting display device comprises: a substrate including a transistor region; a buffer layer and a semiconductor layer sequentially formed on the substrate; a gate electrode formed on the semiconductor layer; an interlayer insulating film formed on the gate electrode; source and drain electrodes, each formed on the interlayer insulating film and having a portion penetrating the interlayer insulating film so as to contact the semiconductor layer; a mask pattern formed on each of the source and drain electrodes; and a pixel defined layer formed on the mask pattern.

20 Claims, 5 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 7 Jan., 2011 and there duly assigned Ser. No. 10-2011-0001965.

BACKGROUND OF THE INVENTION

1. Field of the Invention

The present invention relates to an organic light-emitting display device and a method of manufacturing the same, and more particularly, to an organic light-emitting display device which is structured to prevent the formation of a parasitic capacitor between source and drain electrodes and a cathode layer, and a method of manufacturing the organic light-emitting display device.

2. Description of the Related Art

The rapid development of the information technology (IT) industry is dramatically increasing the use of display devices. Recently, there have been demands for display devices that are lightweight and thin, consume low power and provide high resolution. To meet these demands, liquid crystal displays or organic light-emitting displays using organic light-emitting characteristics are being developed.

Organic light-emitting displays, which are next-generation display devices having self light-emitting characteristic, have better characteristics than liquid crystal displays in terms of viewing angle, contrast, response speed and power consumption, and can be manufactured so as to be thin and lightweight since a backlight is not required.

An organic light-emitting display includes a substrate having a pixel region and a non-pixel region, and a container or another substrate which is placed so as to face the substrate for encapsulation and attached to the substrate by a sealant such as epoxy. In the pixel region of the substrate, a plurality of organic light-emitting devices are connected in a matrix pattern between scan lines and data lines so as to form pixels. In the non-pixel region, the scan lines and the data lines extending from the scan lines and the data lines of the pixel region, power source supply lines for operating the organic light-emitting devices, and a scan driver and a data driver for processing signals received from an external source via input pads and providing the processed signals to the scan lines and the data lines are formed.

SUMMARY OF THE INVENTION

Generally, a pixel defined layer is formed on source and drain electrodes which constitute a transistor of an organic light-emitting display device, and a cathode layer is formed on the pixel defined layer. The problem here is that a parasitic capacitor is formed between the source and drain electrodes and the cathode layer.

The present invention provides an organic light-emitting display device having improved reliability.

The present invention also provides a method of manufacturing the organic light-emitting display device having improved reliability.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, there is provided an organic light-emitting display device comprising: a substrate including a transistor region; a buffer layer and a semiconductor layer sequentially formed on the substrate; a gate electrode formed on the semiconductor layer; an interlayer insulating film formed on the gate electrode; source and drain electrodes, each formed on the interlayer insulating film and having a portion penetrating the interlayer insulating film so as to contact the semiconductor layer; a mask pattern formed on each of the source and drain electrodes; and a pixel defined layer formed on the mask pattern.

According to another aspect of the present invention, there is provided an organic light-emitting display device comprising: a substrate including a transistor region; a buffer layer and a semiconductor layer sequentially formed on the substrate; a gate electrode formed on the semiconductor layer; an interlayer insulating film formed on the gate electrode; source and drain electrodes, each formed on the interlayer insulating film and having a portion penetrating the interlayer insulating film so as to contact the semiconductor layer; an organic material layer formed on the source and drain electrodes and the interlayer insulating film; and an organic light-emitting layer and a cathode layer sequentially formed on the organic material layer; wherein the organic material layer comprises n organic material layers on elements other than the source and drain electrodes, and comprises (n+1) organic material layers on the source and drain electrodes, where n is a natural number equal to or greater than one.

According to another aspect of the present invention, there is provided a method of manufacturing an organic light-emitting display device. The method comprises: providing a substrate which includes a transistor region; sequentially forming a buffer layer and a semiconductor layer on the substrate; forming a gate electrode on the semiconductor layer; forming an interlayer insulating film on the gate electrode; forming contact holes in the interlayer insulating film so as to expose the semiconductor layer; forming a source and drain electrode layer on the interlayer insulating film to fill the contact holes; forming a mask pattern for forming each of source and drain electrodes on the source and drain electrode layer; patterning the source and drain electrode layer using the mask pattern; and forming a pixel defined layer on the mask pattern.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
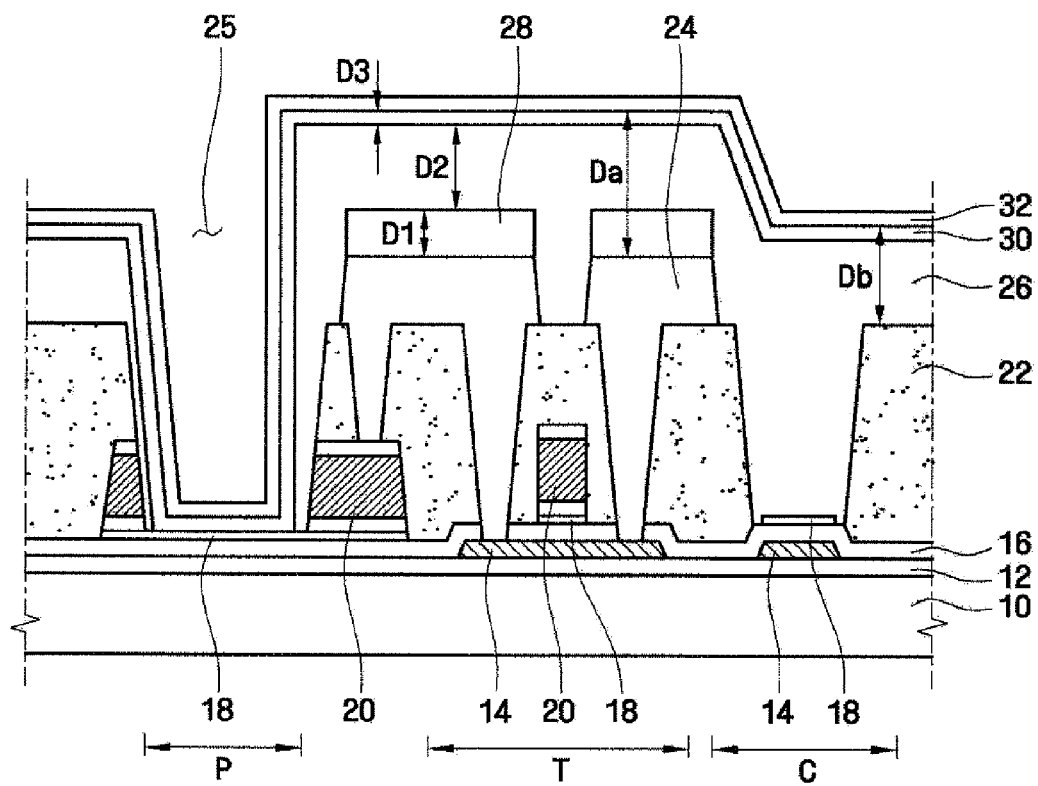
FIG. 1 is a cross-sectional view of an organic light-emitting display device according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity. Like reference numerals refer to like elements throughout the specification. As used herein, the term "and/or" includes any and all combinations of one or more of the associated listed items.

The terminology used herein is for the purpose of describing particular embodiments only, and is not intended to be limiting of the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc. may be used herein to describe various elements, these elements should not be limited by these terms. These terms are only used to distinguish one element from another element. Thus, a first element discussed below could be termed a second element without departing from the teachings of the present invention Embodiments of the invention are described herein with reference to planar and cross-section illustrations which are schematic illustrations of idealized embodiments of the invention. As such, variations from the shapes of the illustrations, as a result (for example) of manufacturing techniques and/or tolerances, are to be expected. Thus, embodiments of the invention should not be construed as limited to the particular shapes of regions illustrated herein, but are to include deviations in shapes that result, for example, from manufacturing. Thus, the regions illustrated in the figures are schematic in nature, and their shapes are not intended to illustrate the actual shape of a region of a device, and are not intended to limit the scope of the invention.

Unless otherwise defined, all terms (including technical and scientific terms) used herein have the same meaning as commonly understood by one of ordinary skill in the art to which this invention pertains. It will be further understood that terms, such as those defined in commonly used dictionaries, should be interpreted as having a meaning which is consistent with their meaning in the context of the relevant art, and will not be interpreted in an idealized or overly formal sense unless expressly so defined herein.

Hereinafter, an organic light-emitting display device according to an exemplary embodiment of the present invention will be described with reference to FIG. 1.

FIG. 1 is a cross-sectional view of an organic light-emitting display device according to an exemplary embodiment of the present invention.

The organic light-emitting display device according to the current exemplary embodiment includes a substrate 10 including a transistor region T, a buffer layer 12 and a semiconductor layer 14 sequentially formed on the substrate 10, a gate electrode 20 formed on the semiconductor layer 14, an interlayer insulating film 22 formed on the gate electrode 20, source and drain electrodes 24, each formed on the interlayer insulating film 22 and having a portion penetrating the interlayer insulating film 22 to contact the semiconductor layer 14, a mask pattern 28 formed on each of the source and drain electrodes 24, and a pixel defined layer 26 formed on the mask pattern 28.

The substrate 10 may be made of a transparent glass material containing $SiO_2$ as a main component. However, the material which forms the substrate 10 is not limited to the transparent glass material. The substrate 10 may also be made of a transparent plastic material which may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

As shown in the drawing, the substrate 10 may include a pixel region P which substantially emits light using an organic light-emitting layer 30 formed thereon, the transistor region T on which a thin-film transistor is formed, and a capacitor region C which maintains a driving voltage constant.

In a bottom emission organic light-emitting display device in which an image is realized toward the substrate 10, the substrate 10 may be made of a transparent material. However, in a top emission organic light-emitting display device in which an image is realized away from the substrate 10, the substrate 10 may not necessarily be made of a transparent material. In this case, the substrate 10 may be made of metal. When the substrate 10 is made of metal, the substrate 10 may contain at least one material selected from the group consisting of carbon (C), iron (Fe), chrome (Cr), manganese (Mn), nickel (Ni), titanium (Ti), molybdenum (Mo), and stainless steel (SUS). However, the material that forms the substrate 10 is not limited to the above materials. The substrate 10 may also be made of metal foil.

The buffer layer 12 may be formed on the substrate 10 to planarize the substrate 10 and prevent penetration of impurities into the substrate 10. The buffer layer 12 is provided on the entire surface of the substrate 10 and may be a single layer of $SiO_x$, $SiN_x$ or $SiO_2N_x$, or a multilayer of these materials.

The semiconductor layer 14 is formed on the buffer layer 12. The semiconductor layer 14 may be made of silicon (Si), i.e., amorphous silicon (a-Si). Alternatively, the semiconductor layer 14 may be made of polycrystalline silicon (p-Si). Otherwise, the semiconductor layer 14 may be made of, but is not limited to, Ge, GaP, GaAs, or AlAs. The semiconductor layer 14 may be a silicon semiconductor layer formed by lightly diffusing n-type impurities of a silicon-on-insulator (SOI) substrate. Alternatively, the semiconductor layer 14 may be formed by doping a portion of amorphous silicon with P- or N-type impurities. As shown in the drawing, the semiconductor layer 14 may be formed on each of the transistor region T and the capacitor region C of the substrate 10. The semiconductor layer 14 formed on the capacitor region C may form a capacitor together with a transparent electrode 18 formed above the semiconductor layer 14.

As shown in the drawing, the semiconductor layer 14 may be formed on both the transistor region T and the capacitor region C by the same process. However, the configuration of the semiconductor layer 14 formed on the transistor region T may be partially different from that of the semiconductor layer 14 formed on the capacitor region C. Accordingly, they have different effects.

That is, the semiconductor layer 14 of the transistor region T causes an electric current to flow to the source and drain electrodes 24 according to a gate voltage applied to the gate electrode 20, so that the current is finally supplied to the transparent electrode 18 of the pixel region P, causing the organic light-emitting layer 30 formed on the pixel region P to emit light. Therefore, only part of the semiconductor layer 14 of the transistor region T may be doped with impurities.

On the other hand, the semiconductor layer 14 of the capacitor region C should be a conductor so as to form a capacitor with the transparent electrode 18 above it. Therefore, the entire region of the semiconductor layer 14 of the capacitor region C may be doped with impurities so as to have properties of a conductor.

A gate insulating film 16 may be formed on the semiconductor layer 14. The gate insulating film 16 covers the semiconductor layer 14 and insulates the semiconductor layer 14 from the transparent electrode 18 thereon. Like the buffer layer 12, the gate insulating film 16 may be a single layer of $SiO_2$, $SiN_x$ or $SiO_2N_x$, or a multilayer of these materials. The gate insulating film 16 may be made of the same material as the buffer layer 12 or of a different material from that of the buffer layer 12.

The transparent electrode 18 may be formed on the gate insulating film 16 of each of the pixel region P, the transistor region T and the capacitor region C. As described above, the transparent electrode 18 of the capacitor region C may form a capacitor together with the semiconductor layer 14 under it, and the driving voltage of the organic light-emitting display device according to the current exemplary embodiment may be maintained constant by the capacitor.

The transparent electrode 18 may be made of a transparent conductive material. The transparent conductive material may include one or more materials selected from indium tin oxide (ITO), indium zinc oxide (IZO), carbon nanotubes, a conductive polymer, and nanowires. That is, the transparent electrode 18 may be made of a mixture of one or more of the transparent conductive materials.

The transparent electrode 18 of the capacitor region C may form a capacitor together with the underlying semiconductor layer 14 which is doped to have properties of a conductor. The transparent electrode 18 of the transistor region T may deliver a gate driving voltage together with the gate electrode 20 thereon. The transparent electrode 18 of the pixel region P may form a pixel unit which is connected to the source and drain electrodes 24 of the transistor region T so as to receive a driving voltage which causes the organic light-emitting layer 30 to emit light.

The gate electrode 20 may be formed on the transparent electrode 18 of the transistor region T. The gate electrode 20 may control light emission of each pixel by transmitting a gate signal to each pixel.

For example, the gate electrode 20 may be a single layer of Al or an Al alloy, such as Cr—Al, Mo—Al or Al—Nd, or a multilayer of a Cr or Mo alloy and an Al alloy stacked on the Cr or Mo alloy. In the current exemplary embodiment, the gate electrode 20 may have a three-layered structure of Mo—Al—Mo. Together with the transparent electrode 18 (made of ITO) under it, the gate electrode 20 may form a four-layered structure of ITO-Mo—Al—Mo.

The interlayer insulating film 22 may be formed on the gate electrodes 20. The interlayer insulating film 22 electrically insulates the gate electrode 20 from the source and drain electrodes 24. The interlayer insulating film 22 may be made of, for example, an inorganic material. Like the buffer layer 12, the interlayer insulating film 22 may be a single layer of $SiO_x$, $SiN_x$ or $SiO_2N_x$, or a multilayer of these materials.

The source and drain electrodes 24 electrically connected to the semiconductor layer 14 may be formed on the interlayer insulating film 22. Here, the source and drain electrodes 24 may be made of any one material selected from Mo, Cr, W, MoW, Al, Al—Nd, Ti, TiN, Cu, a Mo alloy, an Al alloy, and a Cu alloy. The source and drain electrodes 24 are electrically connected by the semiconductor layer 14 and apply a voltage to the transparent electrode 18 of the pixel region P.

The mask pattern 28 is formed on each of the source and drain electrodes 24. The mask pattern 28 may be made of an acryl-, imide-, or olefin-based organic material. In addition, the mask pattern 28 may be used as an etch mask in a patterning process of the source and drain electrodes 24. Accordingly, each of the source and drain electrodes 24 may be aligned by the mask pattern 28.

The pixel defined layer 26 may be formed on the entire region of the substrate 10, excluding, e.g., the pixel region P. More specifically, the pixel defined layer 26 is formed on the entire region of the substrate 10 so as to cover elements of the transistor region T and the capacitor region C. In the pixel defined layer 26, an aperture 25 exposing a portion of the transparent electrode 18 of the pixel region P is formed to define the pixel unit. The pixel defined layer 26 may be made of an organic material.

The organic light-emitting layer 30 and a cathode layer 32 may be sequentially formed on the pixel defined layer 26. The light-emitting layer 30 may be made of an organic material, and the cathode layer 32 may be made of a conductive material. Materials well-known in the art to which the present invention pertains may be used to form the organic light-emitting layer 30 and the cathode layer 32. The pixel defined layer 26 may be made of the same or a different material relative to the mask pattern 28.

Referring to FIG. 1, the organic light-emitting layer 30, the pixel defined layer 26, and the mask pattern 28 are formed on each of the source and drain electrodes 24 of the transistor region T and under the cathode layer 32, while only the organic light-emitting layer 30 and the pixel defined layer 26 are formed on elements other than the source and drain electrodes 24 and under the cathode layer 32. As described above, the mask pattern 28 and the pixel defined layer 26 may be made of an organic material. Also, the organic light-emitting layer 30 may be made of an organic material.

Accordingly, when the mask pattern 28 has a first thickness D1, the pixel defined layer 26 has a second thickness D2, and the organic light-emitting layer 30 has a third thickness D3, a thickness Da of an organic material formed on the source and drain electrodes 24 is equal to the sum of the first through third thicknesses D1 through D3. On the other hand, a thickness Db of an organic material formed on the elements other than the source and drain electrodes 24 is equal to the sum of the second thickness D2 of the pixel defined layer 26 and the third thickness D3 of the organic light-emitting layer 30. Therefore, the thickness Da of the organic material formed on the source and drain electrodes 24 may be greater than the thickness Db of the organic material formed on the elements other than the source and drain electrodes 24.

From a different point of view, if the mask pattern 28 and the pixel defined layer 26 are referred to as organic material layers, it can be said that the organic material layers are formed on the source and drain electrodes 24 and the interlayer insulating film 22, and that the organic light-emitting layer 30 and the cathode layer 32 are sequentially formed on the organic material layers. In addition, it can be said that n (n is a natural number equal to or greater than 1) organic material layers are formed on the elements other than the source and drain electrodes 24, and that (n+1) organic material layers are formed on the source and drain electrodes 24.

That is, referring to FIG. 1, while only the pixel defined layer 26 is provided on the elements other than the source and drain electrodes 24, the pixel defined layer 26 and the mask pattern 28 are provided on the source and drain electrodes 24.

Furthermore, when the pixel defined layer 26 includes a plurality of organic material layers, e.g., n organic material layers, the n organic material layers are provided on the elements other than the source and drain electrodes 24, whereas the mask pattern 28 is further provided on each of the source and drain electrodes 24 in addition to the pixel defined layer 26. That is, since one more organic material layer is added to the n organic material layers, (n+1) organic material layers are provided on the source and drain electrodes 24.

Since the mask pattern 28 made of an organic material is formed on each of the source and drain electrodes 24, the distance between the source and drain electrodes 24 and the cathode layer 32 may be relatively increased. Accordingly, parasitic capacitance can be prevented from being generated by the source and drain electrodes 24 and the cathode layer 32 and affecting the device. Furthermore, a process of removing the mask pattern 28 used to pattern each of the source and drain electrodes 24 is not performed. Therefore, the deterioration of the device due to the removal process of the mask pattern 28 can be prevented. In addition, the omission of this removal process simplifies the entire manufacturing process and improves processing efficiency.

Hereinafter, a method of manufacturing an organic light-emitting display device according to an exemplary embodiment of the present invention will be described with reference to FIGS. 2 through 6.

FIGS. 2 through 6 are cross-sectional views of intermediate structures for explaining a method of manufacturing an organic light-emitting display device according to an exemplary embodiment of the present invention. For simplicity, a description of elements substantially identical to those described above will be omitted or simplified.

Figure 5:
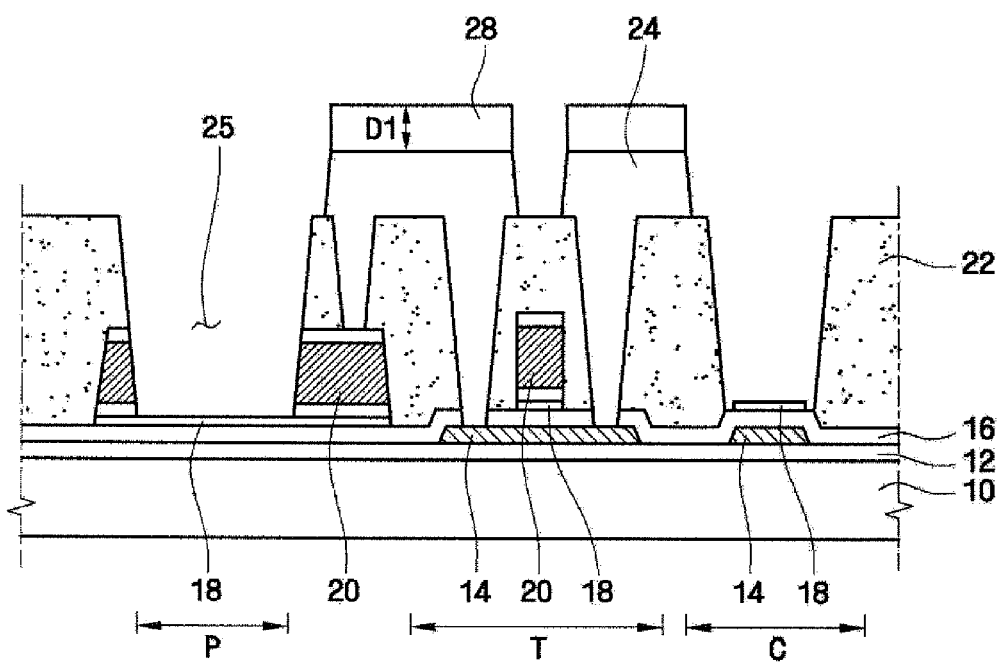
Figure 6:
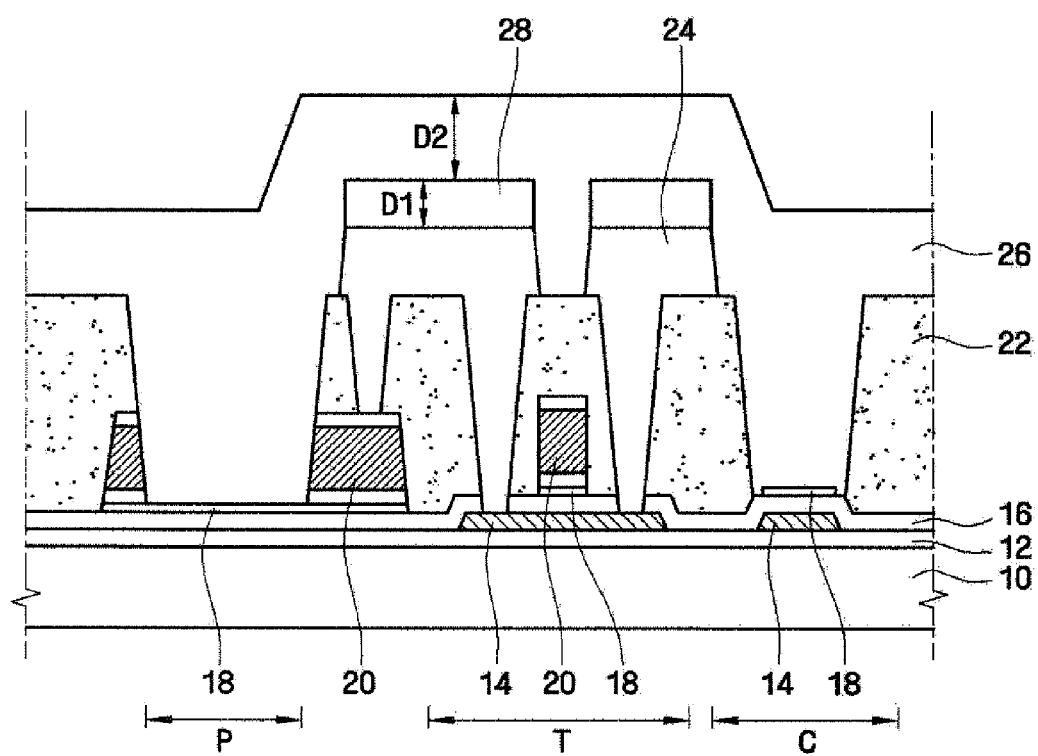

The method of manufacturing an organic light-emitting display device according to the current exemplary embodiment includes providing a substrate 10 (FIG. 2) which includes a transistor region T, sequentially forming a buffer layer 12 and a semiconductor layer 14 on the substrate 10, forming a gate electrode 20 on the semiconductor layer 14, forming an interlayer insulating film 22 (FIG. 3) on the gate electrode, forming contact holes in the interlayer insulating film 22 to expose the semiconductor layer 14, forming a source and drain electrode layer 24a on the interlayer insulating film 22 to fill the contact holes, forming a mask pattern 28 for forming source and drain electrodes 24 on the source and drain electrode layer 24a (FIG. 4), patterning the source and drain electrode layer 24a using the mask pattern 28 (FIG. 5), and forming a pixel defined layer 26 on the mask pattern 28 (FIG. 6).

Figure 2:
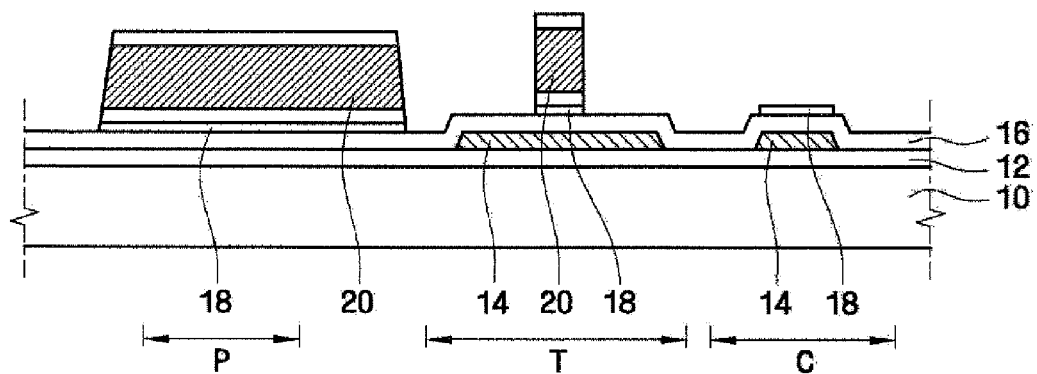
FIGS. 2 through 6 are cross-sectional views of intermediate structures for explaining a method of manufacturing an organic light-emitting display device according to an exemplary embodiment of the present invention.

Referring to FIG. 2, the buffer layer 12 and the semiconductor layer 14 are sequentially formed on the substrate 10, and the gate electrode 20 is formed on the semiconductor layer 14.

A capacitor region C, a pixel region P and the transistor region T are arbitrarily defined regions. The capacitor region C is a region of the substrate 10 other than the transistor region T, on which a transparent electrode 18 and the semiconductor layer 14 are made to remain so as to form a capacitor. The pixel region P is a region which actually emits light using an organic light-emitting layer 30 formed thereon. The transistor region T is a region on which a thin-film transistor, including the gate electrode 20, the source and drain electrodes 24 and the semiconductor layer 14, is formed so as to apply a driving voltage to the organic light-emitting layer 30 of the pixel region P.

The buffer layer 12 may be formed on the substrate 10 to planarize the substrate 10 and prevent the penetration of impurities into the substrate 10. Furthermore, the semiconductor layer 14 may be formed on the buffer layer 12, and a gate insulating film 16 may be formed on the substrate 10 having the semiconductor layer 14.

As described above, the semiconductor layer 14 may be formed on the transistor region T to form a thin-film transistor, and may be formed on the capacitor region C to form an electrode of the capacitor. More specifically, the semiconductor layer 14 may be formed by providing amorphous silicon or polysilicon on the entire region of the substrate 10 which includes the transistor region T and the capacitor region C, and removing the amorphous silicon or polysilicon from a region other than the transistor region T an the capacitor region C. As described above, the semiconductor layer 14 of the transistor region T may be made of the same material as the semiconductor layer 14 of the capacitor region C. However, the semiconductor layer 14 of the transistor region T and that of the capacitor region C may be doped differently. That is, all or part of the semiconductor layer 14 of the transistor region T may be doped with impurities, whereas the entirety of the semiconductor layer 14 of the capacitor region C is doped with impurities to form a conductor.

Next, the transparent electrode 18 and the gate electrode 20 may be formed on the gate insulating film 16. Since the transparent electrode 18 and the gate electrode 20 are formed consecutively, they are electrically connected to each other. However, the transparent electrode 18 and the gate electrode 20 may be electrically insulated from the semiconductor layer 14 thereunder by the gate insulating film 16 thereunder. The transparent electrode 18 may be a transparent conductive material such as ITO or IZO, and the gate electrode 20 may be a single layer of metal or a stack of multiple metal layers.

Figure 3:
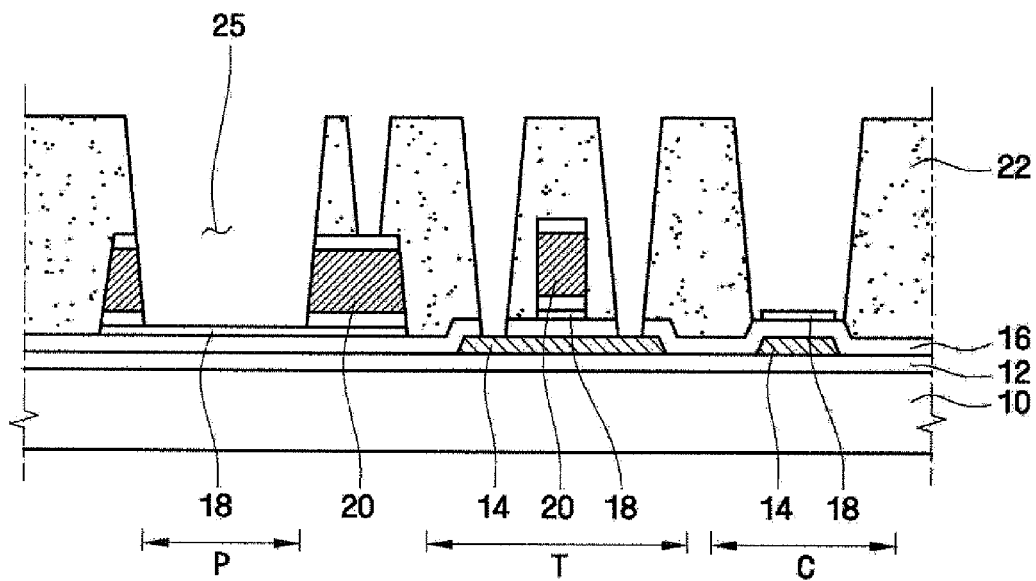

Referring to FIG. 3, the interlayer insulating film 22 is formed on the gate electrode 20.

More specifically, an insulating material is coated on the entire surface of the substrate 10 having the gate electrode 20, and is then patterned to form an aperture 25 which exposes the transparent electrode 18 of the pixel region P and the contact holes which expose the semiconductor layer 14. As described above, the interlayer insulating film 22 may be made of an inorganic material. As shown in the drawing, the interlayer insulating film 22 may be formed on the entire region of the substrate 10 which includes the pixel region P, the transistor region T, and the capacitor region C. On the transistor region T, the interlayer insulating film 22 may electrically insulate the transparent electrode 18 and the gate electrode 20 from the source and drain electrodes 24.

Figure 4:
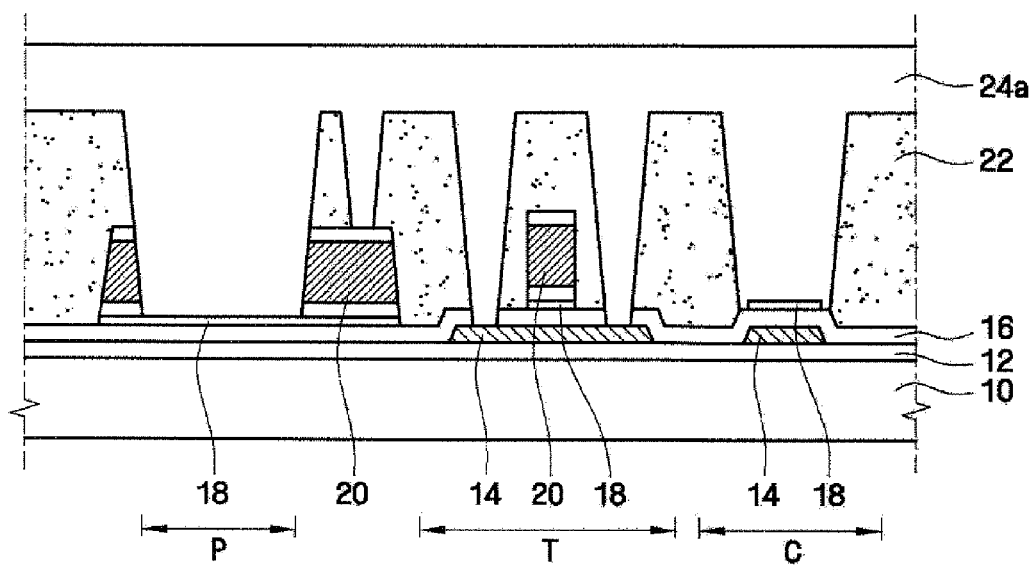

Referring to FIG. 4, the source and drain electrode layer 24a is formed on the interlayer insulating film 22 so as to fill the contact holes. The source and drain electrode layer 24a may be made of a conductive material, and specific examples of the conductive material are as described above.

Referring to FIG. 5, the mask pattern 28 for forming the source and drain electrodes 24 is formed on the source and drain electrode layer 24a, and the source and drain electrode layer 24a is patterned using the mask pattern 28.

As shown in FIG. 5, the forming of the mask pattern 28 may include forming a mask pattern layer containing a first organic material on the source and drain electrode layer 24a, and selectively removing the mask pattern layer such that portions of the mask pattern layer, which correspond to regions in which the source and drain electrodes 24 are to be formed, remain. In this regard, the first organic material may be an acryl-, imide-, or olefin-based material.

Next, the source and drain electrode layer 24a is patterned using the mask pattern 28 as an etch mask, thereby forming the source and drain electrodes 24. In this regard, the forming of the source and drain electrodes 24 may include performing, for example, a dry-etching process. Although not shown in the drawing, after the mask pattern 28 is formed, a first curing process may be performed on the mask pattern 28 at a first temperature. Such a curing process performed at a predetermined temperature can stabilize the mask pattern 28 which has undergone the etching process.

Referring to FIG. 6, the pixel defined layer 26 is formed on the mask pattern 28.

More specifically, the forming of the pixel defined layer 26 may include forming the pixel defined layer 26 on the mask pattern 28 without removing the mask pattern 28 disposed on each of the source and drain electrodes 24. Like the mask pattern 28, after the pixel defined layer 26 is formed, a second curing process may be performed at a second temperature. The second curing process on the pixel defined layer 26 may be performed at a lower temperature than the temperature for the first curing process performed on the mask pattern 28. This is to minimize the effect of a curing process of the pixel defined layer 26 on the mask pattern 28.

Referring back to FIG. 1, the aperture 25 corresponding to the pixel region P may be formed in the pixel defined layer 26, and the organic light-emitting layer 30 and a cathode layer 32 may be sequentially formed on the pixel defined layer 26 having the aperture 25. Accordingly, the organic light-emitting layer 30, the pixel defined layer 26 and the mask pattern 28 may be formed on the source and drain electrodes 24 of the transistor region T under the cathode layer 32, while only the organic light-emitting layer 30 and the pixel defined layer 26 are formed on elements other than the source and drain electrodes 24 under the cathode layer 32.

In the method of manufacturing an organic light-emitting display device according to the current exemplary embodiment, since the mask pattern 28 containing an organic material is formed on each of the source and drain electrodes 24, the distance between the source and drain electrodes 24 and the cathode layer 32 may be relatively increased. Accordingly, parasitic capacitance can be prevented from being generated by the source and drain electrodes 24 and the cathode layer 32 and affecting a device. As a result, an organic light-emitting display with improved reliability can be manufactured.

Furthermore, a process of removing the mask pattern 28 used to pattern each of the source and drain electrodes 24 is not performed. Therefore, the deterioration of the device due to the removal process of the mask pattern 28 can be prevented. In addition, the omission of this removal process simplifies the entire manufacturing process and improves processing efficiency.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only, and not for purposes of limitation.

What is claimed is:

1. An organic light-emitting display device, comprising:
   a substrate including a transistor region;
   a buffer layer and a semiconductor layer sequentially formed on the substrate;
   a gate electrode formed on the semiconductor layer;
   an interlayer insulating film formed on the gate electrode;
   source and drain electrodes, each formed on the interlayer insulating film and having a portion penetrating the interlayer insulating film to contact the semiconductor layer;
   a mask pattern formed on each of the source and drain electrodes; and
   a pixel defined layer formed on the mask pattern.

2. The device of claim 1, wherein the mask pattern is an organic material.

3. The device of claim 2, wherein the mask pattern is one of an acryl-based material, an imide-based material, and an olefin-based material.

4. The device of claim 2, wherein the mask pattern and the pixel defined layer are different organic materials.

5. The device of claim 1, further comprising an organic light-emitting layer and a cathode layer sequentially formed on the pixel defined layer.

6. The device of claim 5, wherein the organic light-emitting layer, the pixel defined layer and the mask pattern are formed on the source and drain electrodes of the transistor region under the cathode layer, and the organic light-emitting layer and the pixel defined layer are formed on elements other than the source and drain electrodes under the cathode layer.

7. The device of claim 1, wherein a first thickness of an organic material formed on the source and drain electrodes is greater than a second thickness of an organic material formed on elements other than the source and drain electrodes.

8. The device of claim 1, wherein each of the source and drain electrodes is aligned by the mask pattern.

9. An organic light-emitting display device, comprising:
   a substrate including a transistor region;
   a buffer layer and a semiconductor layer sequentially formed on the substrate;
   a gate electrode formed on the semiconductor layer;
   an interlayer insulating film formed on the gate electrode;
   source and drain electrodes, each formed on the interlayer insulating film and having a portion penetrating the interlayer insulating film to contact the semiconductor layer;
   an organic material layer formed on the source and drain electrodes and the interlayer insulating film; and
   an organic light-emitting layer and a cathode layer sequentially formed on the organic material layer;
   wherein the organic material layer comprises n organic material layers disposed on elements other than the source and drain electrodes, and (n+1) organic material layers disposed on the source and drain electrodes, where n is a natural number not less than one.

10. The device of claim 9, wherein the organic material layer comprises a pixel defined layer formed on the source and drain electrodes and the interlayer insulating film, and a mask pattern formed on each of the source and drain electrodes.

11. The device of claim 10, wherein the mask pattern is one of an acryl-based material, an imide-based material, and an olefin-based material.

12. The device of claim 10, wherein each of the source and drain electrodes is aligned by the mask pattern.

13. The device of claim 9, wherein a first thickness of the organic material layer formed on the source and drain electrodes is greater than a second thickness of the organic material layer formed on elements other than the source and drain electrodes.

14. A method of manufacturing an organic light-emitting display device, the method comprising the steps of:
   providing a substrate which includes a transistor region;
   sequentially forming a buffer layer and a semiconductor layer on the substrate;
   forming a gate electrode on the semiconductor layer;
   forming an interlayer insulating film on the gate electrode;

forming contact holes in the interlayer insulating film so as to expose the semiconductor layer;

forming a source and drain electrode layer on the interlayer insulating film to fill the contact holes;

forming a mask pattern for forming each of source and drain electrodes on the source and drain electrode layer;

patterning the source and drain electrode layer using the mask pattern; and forming a pixel defined layer on the mask pattern.

15. The method of claim 14, wherein after the step of forming the mask pattern, the pixel defined layer is formed without removing the mask pattern.

16. The method of claim 14, wherein the step of forming the mask pattern comprises:

forming a mask pattern layer, which contains a first organic material, on the source and drain electrode layer; and selectively removing the mask pattern layer so that regions of the mask pattern layer, which correspond to regions in which the source and drain electrodes are to be formed, remain.

17. The method of claim 16, wherein the first organic material is one of an acryl-based material, an imide-based material, and an olefin-based material.

18. The method of claim 14, further comprising the step of sequentially forming an organic light-emitting layer and a cathode layer on the pixel defined layer.

19. The method of claim 18, wherein the organic light-emitting layer, the pixel defined layer and the mask pattern are formed on the source and drain electrodes of the transistor region under the cathode layer, and the organic light-emitting layer and the pixel defined layer are formed on elements other than the source and drain electrodes under the cathode layer.

20. The method of claim 14, further comprising the steps of performing a first curing process at a first temperature after the mask pattern is formed, and performing a second curing process at a second temperature after the pixel defined layer is formed, wherein the second temperature is lower than the first temperature.

* * * * *